(12) United States Patent
Boeck et al.

(10) Patent No.: US 9,761,701 B2
(45) Date of Patent: Sep. 12, 2017

(54) BIPOLAR TRANSISTOR (71) Applicant: Infineon Technologies AG, Neubiberg (DE)

(72) Inventors: Josef Boeck, Putzbrunn (DE); Wolfgang Liebl, Bad Abbach (DE)

(73) Assignee: Infineon Technologies AG, Neubiberg (DE)

( * ) Notice: Subject to any disclaimer, the term of this patent is extended or adjusted under 35 U.S.C. 154(b) by 171 days.

(21) Appl. No.: 14/267,651

(22) Filed: May 1, 2014

(65) Prior Publication Data
US 2015/0318384 A1 Nov. 5, 2015

(51) Int. Cl.
*H01L 29/732* (2006.01)
*H01L 21/324* (2006.01)
*H01L 21/225* (2006.01)
*H01L 29/06* (2006.01)
*H01L 29/08* (2006.01)
*H01L 29/10* (2006.01)
*H01L 29/417* (2006.01)
(Continued)

(52) U.S. Cl.
CPC .......... *H01L 29/732* (2013.01); *H01L 21/225* (2013.01); *H01L 21/324* (2013.01); *H01L 29/0649* (2013.01); *H01L 29/0804* (2013.01); *H01L 29/1004* (2013.01); *H01L 29/41708* (2013.01); *H01L 29/66234* (2013.01); *H01L 29/66272* (2013.01); *H01L 29/7371* (2013.01)

(58) Field of Classification Search
CPC ............. H01L 21/225; H01L 29/66272; H01L 29/0804
See application file for complete search history.

(56) References Cited

U.S. PATENT DOCUMENTS 7,449,389 B2 11/2008 Meister et al.
7,968,972 B2 6/2011 Bock et al.
(Continued)

FOREIGN PATENT DOCUMENTS

DE 102010001290 A1 8/2010
WO 0163644 A2 8/2001

OTHER PUBLICATIONS

Fursenko, O., et al., "Spectroscopic ellipsometry for in-line process control of SiGe: C HBT technology," Materials Science in Semiconductor Processing, 2005, pp. 273-278, vol. 8, No. 1, Elsevier.

*Primary Examiner* — Caleb Henry
*Assistant Examiner* — Mounir Amer
(74) *Attorney, Agent, or Firm* — Slater Matsil, LLP (57) ABSTRACT A bipolar transistor and a method for fabricating a bipolar transistor are disclosed. In one embodiment the bipolar transistor includes a semiconductor body including a collector region and a base region arranged on top of the collector region, the collector region being doped with dopants of a second doping type and the base region being at least partly doped with dopants of a first doping type and an insulating spacers arranged on top of the base region. The semiconductor body further includes a semiconductor layer including an emitter region arranged on the base region and laterally enclosed by the spacers, the emitter region being doped with dopants of the second doping type forming a pn-junction with the base region, wherein the emitter region is fully located above a horizontal plane through a bottom side of the spacers.

15 Claims, 6 Drawing Sheets (51) Int. Cl.
*H01L 29/66* (2006.01)
*H01L 29/737* (2006.01)

(56) References Cited

U.S. PATENT DOCUMENTS

| | | |
|---|---|---|
| 8,003,475 B2 | 8/2011 | Bock et al. |
| 8,067,290 B2 | 11/2011 | Boeck et al. |
| 8,482,101 B2 | 7/2013 | Benoit et al. |
| 8,492,794 B2 | 7/2013 | Cai et al. |
| 2007/0105330 A1* | 5/2007 | Enicks ............... H01L 29/0817 438/337 |
| 2007/0222032 A1 | 9/2007 | Schaefer et al. |
| 2009/0321788 A1 | 12/2009 | John et al. |
| 2010/0127352 A1 | 5/2010 | El-Diwany et al. |
| 2011/0101500 A1 | 5/2011 | Stenson et al. |
| 2012/0037914 A1 | 2/2012 | Vanhoucke et al. |
| 2013/0032897 A1* | 2/2013 | Narayanan ........ H01L 21/26513 257/410 |
| 2013/0113021 A1* | 5/2013 | Qian .................. H01L 21/2253 257/197 |
| 2013/0146894 A1 | 6/2013 | Cheng et al. |
| 2014/0231961 A1* | 8/2014 | Lin ........................ H01L 29/73 257/565 |

* cited by examiner

BIPOLAR TRANSISTOR

TECHNICAL FIELD

The present disclosure relates to the field of bipolar transistors (BTs) such as, e.g., heterojunction bipolar transistors (HBTs) with an improved high frequency performance. Particularly, a bipolar transistor and a method for fabricating bipolar transistors is disclosed.

BACKGROUND

Bipolar transistors are generally constructed from two pn-junctions lying close together in a semiconductor crystal. In different configurations, either two n-doped regions are separated from one another by a p-doped region (npn transistors) or two p-doped regions by an n-doped region (pnp transistors). The three differently doped regions are referred to as the emitter, the base, and the collector. Therefore, a bipolar transistor is essentially a three terminal device having three doped regions of alternating doping type.

Bipolar transistors may exhibit desirable features such as high current gain and a very high cut-off frequency for switching applications, and high power gain and power density for microwave amplifier applications. These features make bipolar transistors important components in logic circuits, communications systems, and microwave devices. As with other types of semiconductor devices, there is a demand for bipolar transistors having increasingly higher operating frequencies and/or switching speeds. Since their invention in 1947, many attempts have been made to meet these demands and improve the performance of such transistors with respect to their speed, power, and frequency characteristics. These attempts have focused on making devices better suited for high frequency applications such as microwave and logic devices. One particular way to meet these demands for higher frequency operation is to provide a device with a low base resistance and a low base-collector capacitance.

SUMMARY OF THE INVENTION

A bipolar transistor is described. In accordance with one aspect of the present invention the bipolar transistor comprises a semiconductor body that includes a collector region and a base region arranged on top of the collector region. The collector region is doped with dopants of a second doping type and the base region is, at least partly, doped with dopants of a first doping type. Insulating spacers are arranged on top of the base region. This semiconductor layer is laterally enclosed by the spacers and is doped with dopants of the second doping type to provide an emitter region that forms a pn-junction with the base region, wherein the emitter region is fully located above a horizontal plane through a bottom side of the spacers.

Furthermore, a method for fabricating a bipolar transistor is disclosed. In accordance with a first example, the method comprises providing a semiconductor body that includes a collector region and a base region, which is arranged on top of the collector region. The collector region is doped with dopants of a second doping type, and the base region is, at least partially, doped with dopants of a first doping type. The method further comprises forming insulating spacers on top of the base region and, after forming the spacers, depositing a first semiconductor layer on top of the base region, so that the spacers enclose the first semiconductor layer. After depositing the first semiconductor layer a second semiconductor layer, which is doped with dopants of the second doping type, is deposited on top of the first semiconductor layer. The second layer is more heavily doped than the first semiconductor layer. Subsequently, elevated temperatures are applied to the semiconductor body, so that dopants diffuse out of the second semiconductor layer into the first semiconductor layer thus forming an emitter region of the BT in the first and second semiconductor layer.

In accordance with another example of the invention, the method comprises providing a semiconductor body, which includes a collector region and a base region arranged on top of the collector region. The collector region is doped with dopants of a second doping type and the base region is, at least partially, doped with dopants of a first doping type. The method further forming insulating spacers on top of the base region and, depositing a first semiconductor layer on top of the base region, and depositing a second semiconductor layer, which is doped with dopants of the second doping type, on top of the first semiconductor layer, so that the spacers enclose the first and the second semiconductor layers. Elevated temperatures are applied to the semiconductor body so that dopants diffuse out of the second semiconductor layer into the first semiconductor layer thus forming an emitter region of the BT in the first and second semiconductor layer.

BRIEF DESCRIPTION OF THE DRAWINGS

The invention can be better understood with reference to the following drawings and descriptions. The components in the figures are not necessarily to scale; in-stead emphasis is placed upon illustrating the principles of the invention. More-over, in the figures, like reference numerals designate corresponding parts. In the drawings.

DETAILED DESCRIPTION OF ILLUSTRATIVE EMBODIMENTS

Figure 1:
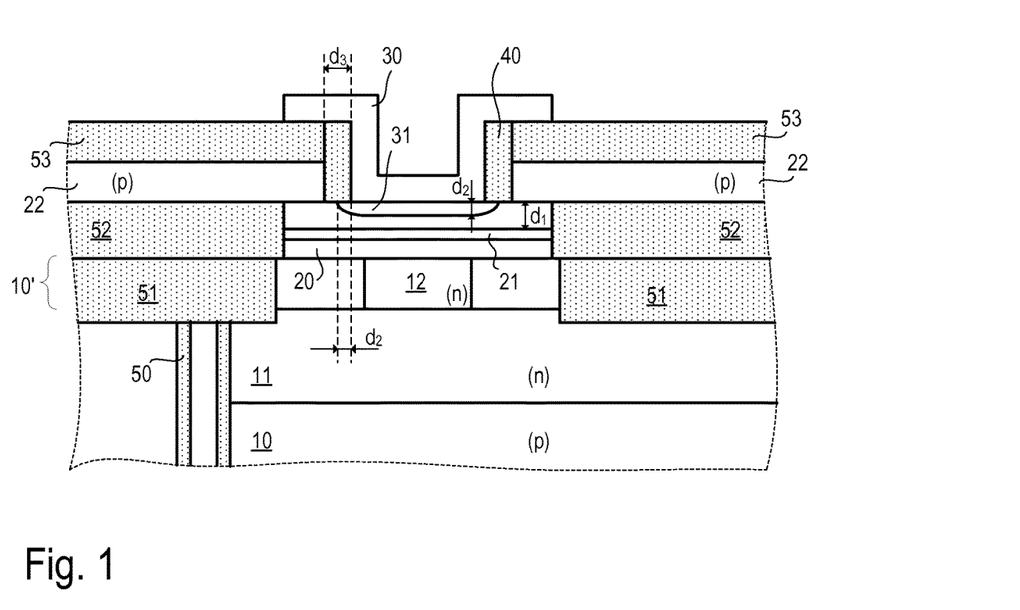
FIG. 1 illustrates one example of a bipolar transistor resulting from a conventional bipolar or BICMOS manufacturing process.

FIG. 1 illustrates a cross sectional view of an exemplary bipolar transistor (BT), which may be fabricated using known bipolar or BICMOS technologies. The transistor is integrated in a semiconductor substrate 10 which is doped with dopants of a first doping type; in the present example a p-doped silicon substrate (silicon wafer) is used to form an npn-type BT. The substrate 10 may include an epitaxial layer 10' formed on a silicon wafer. A buried contact region 11 is arranged in the substrate 10. A collector terminal (not shown) is electrically connected to the contact region 11 to electrically connect a collector region 12, which is arranged in the substrate 10 or the epitaxial layer 10' above the buried contact region 11 and doped with dopants of the second doping type (n-type dopants in the present case). The collector region usually has a higher concentration of dopants than the substrate 10. The mentioned epitaxial layer 10' may include the collector region 12 formed on top of the buried contact region 11. The buried contact region 12 may be also formed using epitaxy. However, ion implantation or diffusion of dopants may be alternatively used.

FIG. 1 also illustrates a deep trench 50 extending vertically into the substrate, thus forming a deep trench isolation (DTI) for isolating the contact region 11 in a lateral direction against the surrounding substrate 10. Trenches 51 are arranged in the substrate to form a shallow trench isolation (STI). In the cross section the shallow trenches 51 are spaced apart such that the mentioned collector region lies (in a horizontal direction) in between the trenches 51. The trenches 51 are filled with an insulating dielectric material, e.g., silicon oxide. In a top view (not shown) the trench 51 may define a quadratic a hexagonal or a circular structure. The deep trench 50 is arranged under the left shallow trench 51. The contact region extends horizontally below the right shallow trench 51. An insulating layer 52 (e.g., silicon oxide layer) is arranged on top of the substrate 10 (and the shallow trenches 51). The insulating layer 52 is structured by forming an opening through the layer 52. The opening may be aligned with the opposing side walls of the two shallow trenches 51.

A base region 20 is disposed in the opening of insulating layer 52 such that the base region 20 lies vertically above the collector region 12 and adjoins the collector region 12 and the surrounding substrate 10. The base region 20 is doped with dopants of the first doping type. In the present example, the base region 20 is p-doped to form an npn-type BT. The base region 20 may be formed of silicon. However, other semiconductor material may be applicable, e.g., SiGe, to form a heterojunction bipolar transistor (HBT). The concentration of dopants is not homogenous within the base region. In a vertical direction, the dopant concentration exhibits a maximum within the base region 20. This maximum is depicted as highly doped layer 21 extending horizontally through the base region 20. This highly doped layer 21 may be regarded as "base" of the BT. The upper portion of the p-doped base region 20, which is above the highly doped layer 21 (base), has a thickness $d_1$ in a vertical direction. This upper portion is referred to as Si-Cap.

Above the insulating layer 52 and the Si-Cap a base contact layer 22 is deposited. For example, polycrystalline silicon may be used for depositing the base contact layer 22. An opening is formed in the base contact layer 22 above the central region of the Si-Cap. As a result, the base contact layer 22 extends in a horizontal direction on both sides of the Si-Cap and overlaps the Si-Cap (upper portion of base region 20) only at its boundary area. The base contact layer 22 is isolated by a further insulating layer 53 (e.g., silicon oxide layer) disposed on the base contact layer 22. The side surfaces of the base contact layer (of the opening in the layer 22) are isolated by spacers 40, which may also be formed of silicon oxide. As a result a cavity (similar to a trench) is formed which extends from the top surface of the insulating layer 53 through the layer 53 and the base contact layer 22 down to the Si-Cap. The side-walls of this trench is covered by the mentioned oxide spacers 40. The trench is at least partially filled by deposition of a doped semiconductor layer 30 (silicon or a different material such as SiGe for some types of HBTs), which forms an emitter region. The semiconductor layer 30 contacts the Si-Cap at the bottom of the mentioned trench and covers the side surfaces of the spacers 40 and the adjoining portion of the top surface of the insulation layer 53.

The semiconductor layer 30 is doped with dopants of the second doping type. In the present example, the emitter region (and thus the layer 30) is n-doped to form an npn-type BT. During the production process, diffusion region 31 is formed within the Si-Cap as dopants diffuse into the Si-Cap, i.e., the upper region of the base region 20. The vertical thickness of the diffusion region 31 is labelled $d_2$. In other words, $d_2$ is the depth which atoms may diffuse from the semiconductor layer 30 into the Si-Cap. In practice, the depth $d_1$ is about 10 nm to 30 nm. As the diffusion is an omnidirectional process, the diffusion region 31 also extends in the horizontal direction under the spacer 40. Thus, the effective distance between the emitter and the highly doped base 20 is the difference $d_1$-$d_2$ between the distance $d_1$ and the diffusion depth $d_2$. In essence, the diffusion region 31 is a portion of the emitter region 30, as the concentration of dopants in the diffusion region 31 is in the same order of magnitude as the concentration of dopants in the semiconductor layer 30 above.

Due to the sideward diffusion under the spacer 40, the (lateral) width $d_3$ of the spacer has to be thicker than the diffusion depth $d_2$ in order to avoid a shortcut between the emitter region (including the diffusion region 31) and the base contact region 22. Furthermore, the distance $d_1$ between the base contact region 22 and the highly doped base 21 has to be chosen greater than the diffusion depth $d_2$, which is comparably high and thus results in a comparably high base resistance. In current technologies the minimum width $d_3$ of the spacer 40 has to be chosen between 30 nm and 100 nm. This prevents further lateral downscaling of the transistor and reduction of the base-collector-capacitance and other important parameters such as base resistance and base-emitter capacitance.

Figure 2:
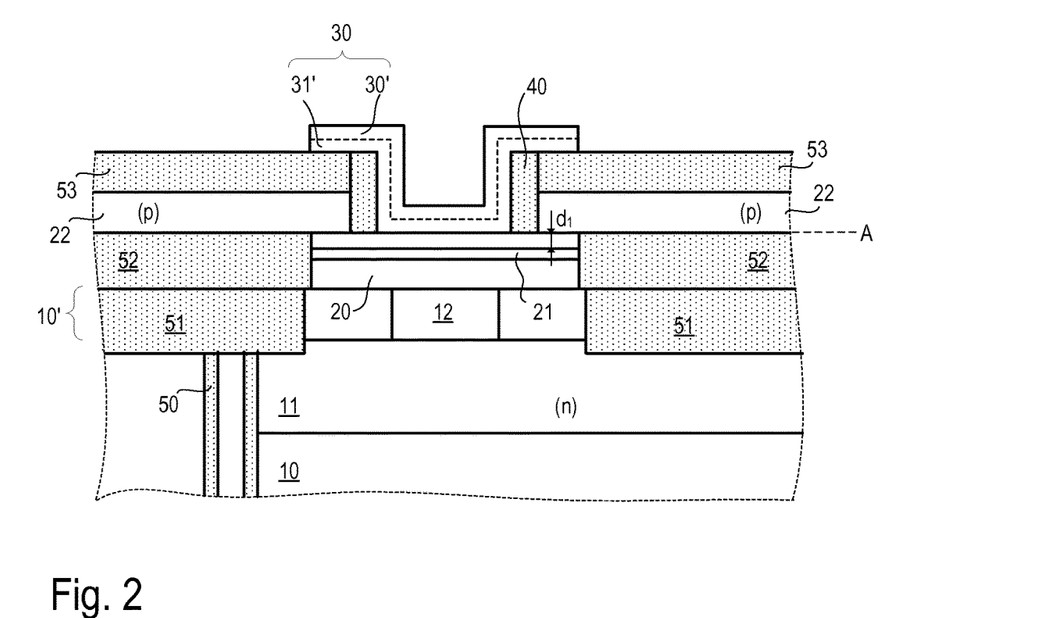
FIG. 2 illustrates one example of an improved bipolar transistor resulting from a bipolar or BICMOS manufacturing process described herein.

The example of FIG. 2 is essentially identical with the example of FIG. 1, with the only difference, that the diffusion of the emitter into the base region 20 (diffusion region 31) is avoided by using an improved production process which will be explained further below. This allows a reduction of the distance $d_1$ between the highly doped base (layer 21) and the base contact layer 22, which results in a lower base resistance and thus allows a higher maximum oscillation frequency of the bipolar transistor. Furthermore, the width $d_3$ of the spacer 40 may be chosen smaller, thus allowing for a further miniaturization of the transistor.

The diffusion of the emitter into the base region 20 (diffusion region 31) is avoided by using a two-step emitter deposition when depositing the emitter region 30. In a first step, a practically undoped semiconductor material is deposited in the above-mentioned trench, similar as described with respect to the emitter region 30 in the example FIG. 1. Practically undoped means a doping concentration so low that practically the same result is achieved as if undoped material would be used. For example, a doping concentration which is an order of magnitude (factor 10) lower that the doping concentration of the final emitter region, can be regarded as practically undoped, as such low doping concentration has no significant electrical effect. The resulting (practically) undoped layer 31' contacts the Si-Cap at the bottom of the above-mentioned trench and covers the side surfaces of the spacers 40 and the adjoining portion of the top surface of the insulation layer 53. On top of this undoped layer 31' a further layer 30' of doped semiconductor material is deposited. The layer 30' is doped using dopants of the second dopant type, which is an n-type dopant in the present example to form an npn-type BT. During the further production process dopants diffuse out of the layer 30' into the undoped layer 31' thus forming the emitter region (cf. emitter to region 30 in the example of FIG. 1). The thickness of the undoped layer 31' may be chosen such, that the diffusion region formed in the layer 31 does not significantly extend into the base region 20.

Below, one exemplary production process for fabricating the BT shown in FIG. 2 is described referring to the FIGS.

Figure 3A:
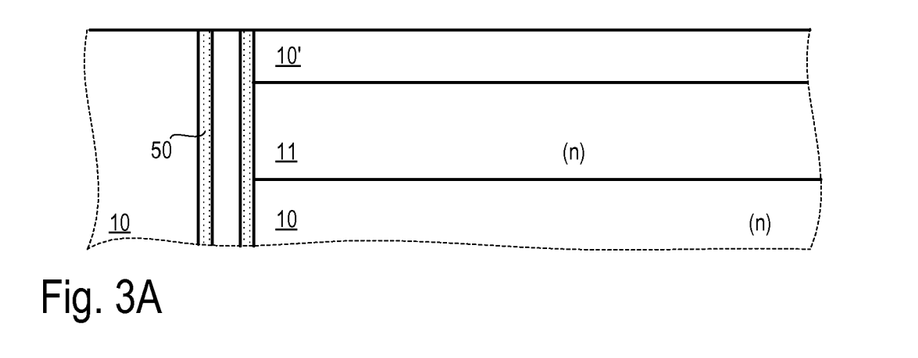
FIGS. 3A-3K describe one example of a process for manufacturing a bipolar transistor as shown in FIG. 2.

3A through 3K. It is understood that, in an actual implementation of the process, the order of the steps may be different from the order described herein. Furthermore, some steps may be substituted with one or more other steps yielding essentially the same result.

The further description starts with a semiconductor substrate 10 including a buried contact region 11 and a deep trench installation 50 as shown in FIG. 3A. The substrate 10 is p-doped, and the buried contact regions 11 is doped with n-type dopants, wherein the concentration of dopants is higher in the contact region 11 than in the surrounding substrate 10. Methods for providing such substrate with buried contact regions and deep trench isolation (DTI) are as such known and thus not further described here in more detail. In the present example, the buried contact region is formed by "burying" the contact region by an epitaxial layer 10' which may be lightly n-doped (but may also be p-doped dependent on the actual implementation of the method).

Figure 3B:
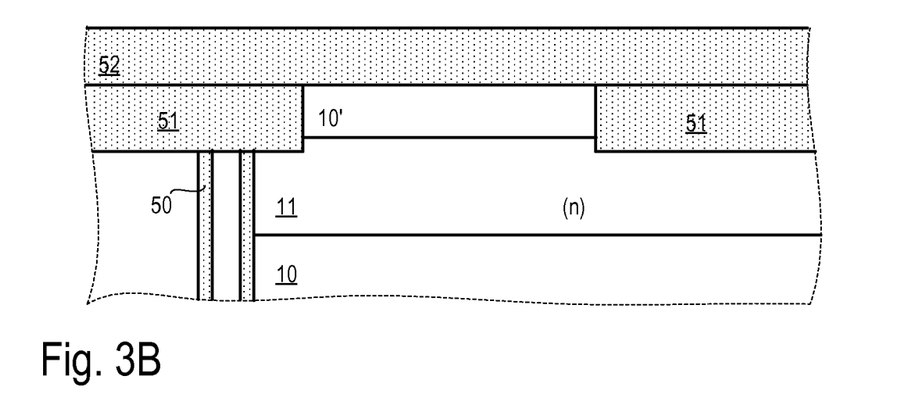
Figure 3C:
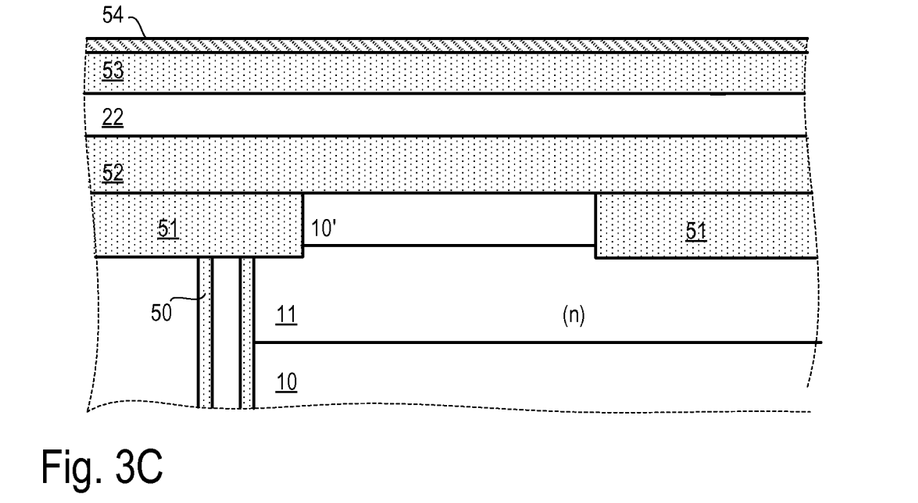

As shown in FIG. 3B shallow trenches 51 are formed in the substrate 10 and the epitaxial layer 10' and filled with insulating material (e.g., silicon oxide) to form a so-called shallow trench isolation (STI). In the present example of FIG. 3B shallow trenches 51 are shown, which have a specific spacing. The portion of the epitaxial layer 10' between the shallow trenches will later serve as collector region of the BT (see FIG. 3F). Subsequently an insulating layer 52 (e.g., silicon oxide) is formed on top of the epitaxial layer 10'. As shown in FIG. 3C a contact layer 22 of conductive material (e.g., polycrystalline silicon) is deposited on top of the insulating layer 52. The contact layer 22 will later serve as base contact region, which is used to electrically connect the base of the BT with an external base terminal. On top of the contact layer 22 another insulating layer 53 is formed (e.g., a silicon oxide layer), which is again covered by another insulating layer 54 that typically consists of another material than the insulating layer 53 (e.g., silicon nitride).

Figure 3D:
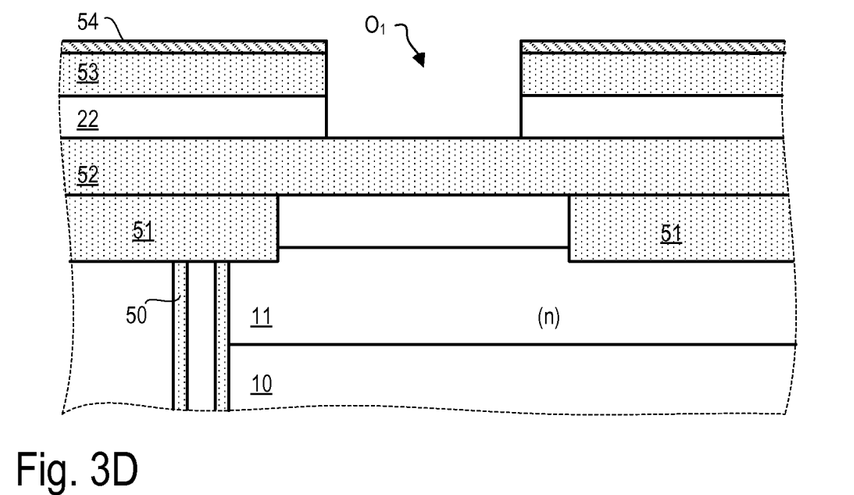
Figure 3E:
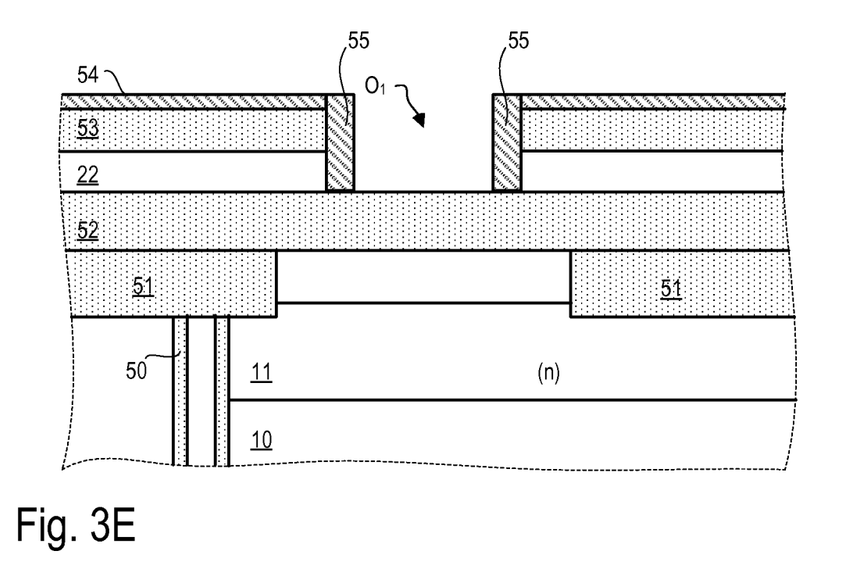
Figure 3F:
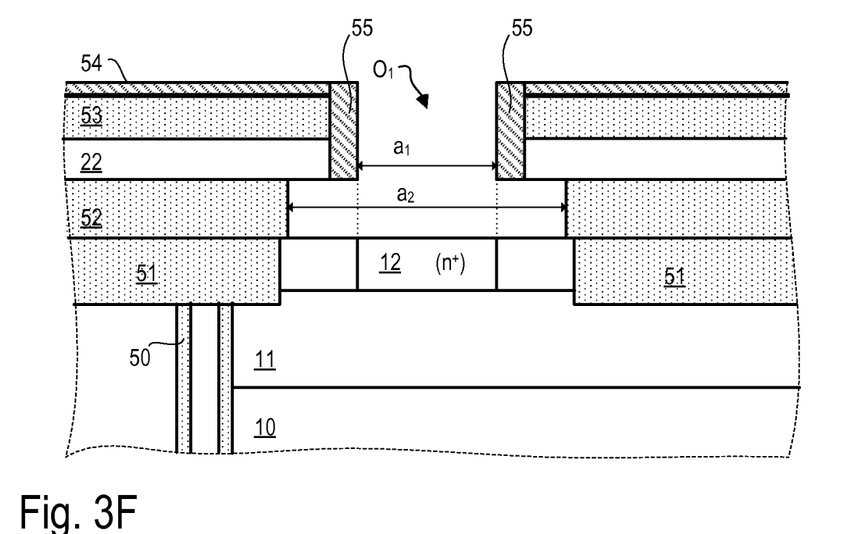

As can be seen in FIG. 3D, an opening $O_1$ is formed through the layers 54, 53 and 22. This can be accomplished by employing photolithography and anisotropic etching. The opening $O_1$ extends from the top of the insulating layer 54 down to the insulating layer 52, so that insulating layer 52 forms the bottom of the opening $O_1$. Subsequently, spacers 55 are formed on the side surface of the opening $O_1$. The spacers 55 may be of the same material as the insulating layer 54, e.g., nitride. This situation is shown in FIG. 3E. In a following step (see FIG. 3F) a portion of the insulating layer 52 is removed using isotropic etching through the opening $O_1$. As can be seen in FIG. 3F the top surface of the epitaxial layer 10' is exposed by the mentioned isotropic etching. Due to undercutting the insulating layer 52 is removed throughout a width $a_2$, which is larger than the width $a_1$ of the opening $O_1$. Before or after the etching of the insulating layer 52, a highly doped collector region 12 is formed in the epitaxial layer 10' at the bottom of the opening $O_1$. The collector region 12 may be produced using ion implantation or diffusion of dopants into the surface of the epitaxial layer 10', which may be done even before etching the opening $O_1$. The lateral width of the collector region 12 may be approximately the same as the lateral width $a_1$ of the opening $O_1$, i.e., the collector region 12 is vertically aligned with the spacers 55. The collector region 12 extends from the top of the epitaxial layer 10' down to the contact region 11, by which the collector region 12 is electrically contacted. The dopants used for doping the collector region 12 are of the second doping type, i.e., the collective region 12 is n-doped in the present example. The concentration of dopants in the collector region 12 is significantly higher than the concentration of dopants in the surrounding epitaxial layer 10'. To indicate this, the doping type is labeled as $n^+$ in FIG. 3F.

Figure 3G:
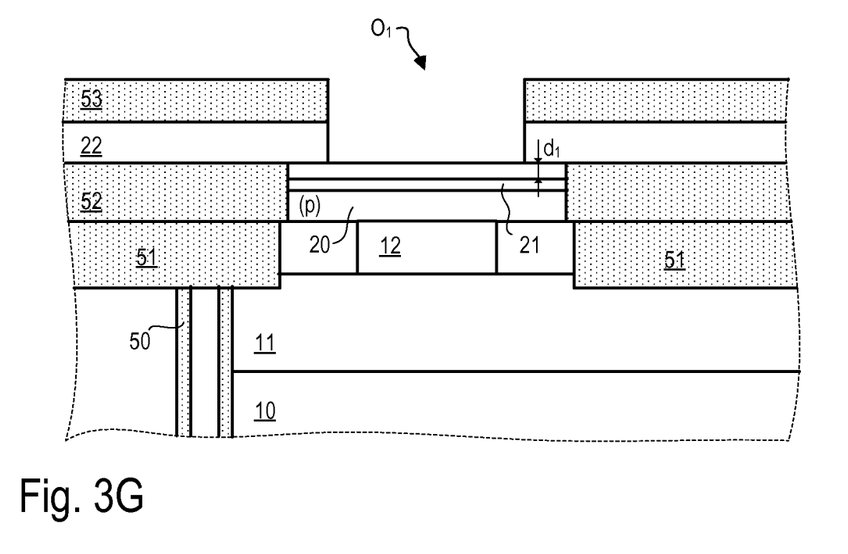

The cavity formed by removing a portion of the insulating layer 52 is then filled (see FIG. 3G) with semiconductor material (e.g., SiGe or silicon) using epitaxy to form a base region 20, which is doped with dopants of the first doping type. In the present example, the base region 20 is p-doped to form an npn-type BT. In a vertical direction, the base region 20 extends from the top surface of the epitaxial layer 10' to the bottom surface of the base contact layer 22. In a horizontal direction, the base region 20 fills the opening which has been formed in the insulating layer 52 in the previous etching step. During deposition of the base region 20 the concentration of dopants is varied so that the maximum concentration of dopants in the base region 20 lies in a thin base layer 21. In a horizontal direction, the thin highly doped base layer 21 extends, through the whole base region 20 at a distance $d_1$ from the top surface of the base layer 20. Thus the distance between the thin highly doped base layer 21 and the base contact region 22 also equals $d_1$. This parameter $d_1$ essentially determines the base resistance in the current path from the external base terminal (not shown) through the base contact region 22 to the highly doped base layer 21. The base resistance can be regarded as an ohmic resistor connected in series to the base-emitter-diode of the BT. This situation is shown in FIG. 3G.

Figure 3H:
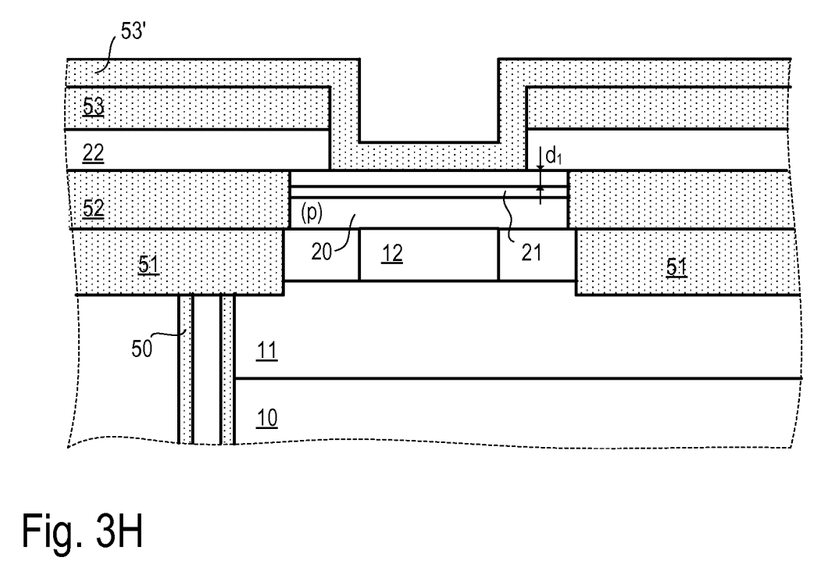

After deposition of the base region 20, the insulation layer 54 as well as the spacers 55 are removed by etching (e.g., using phosphoric acid in case of silicon nitride insulation layer and spacers). In the illustration of FIG. 3G the insulation layer 54 and spacers 55 have been removed. Thus the insulation layer 53 (oxide layer) is exposed. In the next step a further insulation layer 53' is deposited on the top surface of the insulation layer 53 and the base region 20 as shown in FIG. 3H. The side surfaces of the cavity $O_1$, i.e., the exposed side surfaces of layers 53 and 22, are also covered with material (e.g., silicon oxide) of insulation layer 53'. Subsequently, the insulation layer 53' is again removed by anisotropic etching, thereby again exposing the silicon of the base region 20 as well as insulation layer 53. However, spacers 40 remain on the side surfaces of the layers 53 and 22, i.e., on the side surfaces of the cavity $O_1$. In essence, the spacers 55, which may be made of silicon nitride, are replaced by the spacers 40, which may be made of silicon oxide. This situation is shown in FIG. 3I.

Figure 3I:
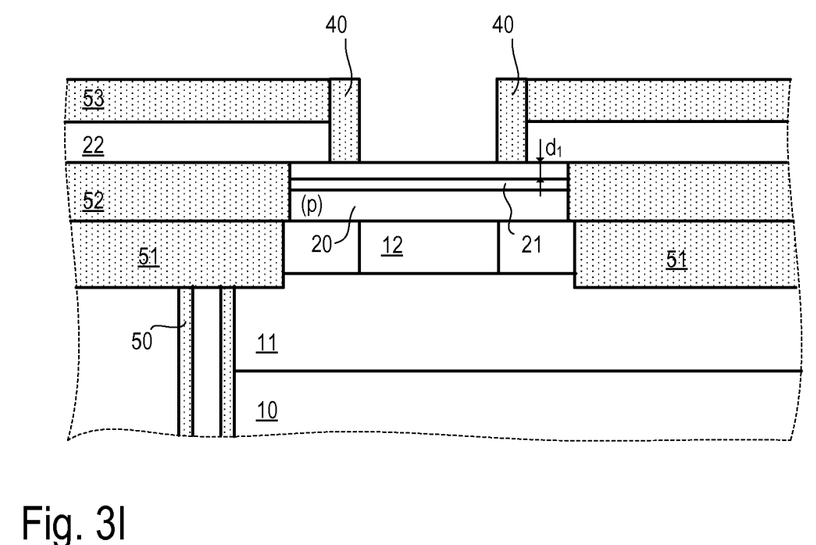
Figure 3J:
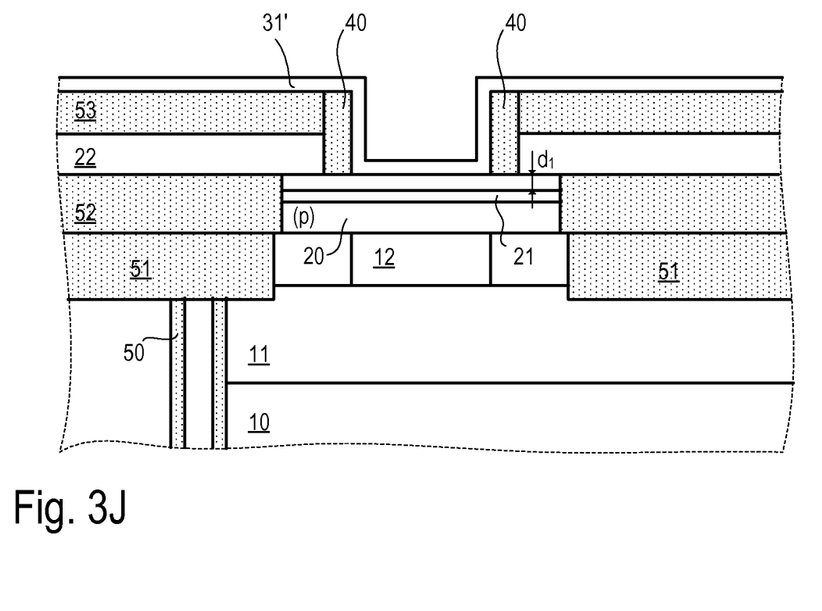
Figure 3K:
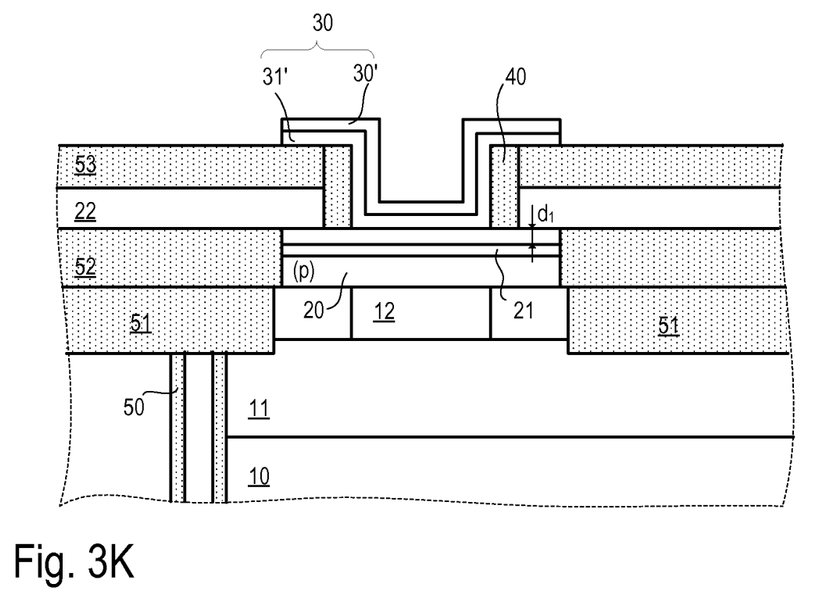

It is understood that there may be many different processes which result in a structure as shown in FIG. 3I or an equivalent structure. In all these processes, however, an undoped silicon layer 31' is deposited on top on the structure shown in FIG. 3J, e.g., using epitaxy. The undoped silicon layer 31' covers the top surface of the insulation layer 53 as well as the top surface of the base region 20 and the side surfaces of the spacers 40. This situation is shown in FIG. 3J. On top of the undoped silicon layer 31' a further silicon layer 30' is deposited, e.g., using epitaxy. This further silicon layer 30' is doped using dopants of the second doping type, which are n-type dopants in the present example to form an npn-type BT. The silicon layers 30' and 31' may be structured, e.g., using, a resist mask and unisotropic etching. Together the silicon layers 30' and 31' form the emitter region 30 of the BT. The resulting structure is shown in FIG. 3K. During the further process the semiconductor component is subject to a heat treatment, and as a result dopants diffuse out from the doped silicon layer 30' into the undoped silicon layer 31', thus forming one doped emitter region.

However, diffusion into the base region 20 as shown in FIG. 1 is avoided by an appropriate dimensioning of the undoped silicon layer 31'. After the mentioned diffusion of dopants into the undoped silicon layer 31' the border between the undoped silicon layer 31' and the doped silicon layer 30 becomes blurred resulting in a structure as shown in FIG. 2. As mentioned, together the silicon layers 30' and 31' form the emitter region 30 of the BT.

Below some important aspects of the embodiments described herein are summarized. It should be noted, however, that this is an exemplary and not an exhaustive enumeration of features. As described above, a bipolar transistor may include a semiconductor body 10 including a collector region 12 and a base region 20 (including the highly doped base layer 21) arranged on top of the collector region 12. The semiconductor body 10 may include an epitaxial layer 10' (see, e.g., FIG. 2) The collector region 12 is doped with dopants of a second doping type (e.g., n-type) and the base region 20 is at least partly doped with dopants of a first doping type (p-type). In particular, the base layer 21 included in the base region may be highly p-doped. Insulating spacers 40 are arranged on top of the base region 20. A semiconductor layer (comprising sub-layers 30' and 31') is arranged on the base region 20 and laterally enclosed (and confined) by the spacers 40. The semiconductor layer (i.e., layers 30' and 31') is doped with dopants of the second doping type (e.g., n-type) to provide an emitter region 30 that forms a pn-junction with the base region 20. The emitter region 30 is fully located above a horizontal plane (see plane labelled A in FIG. 2) through a bottom side of the spacers 40.

In other words, a diffusion of a significant dose of emitter dopants of the second type into the base region is avoided (such as the diffusion region 31 in FIG. 1), and the emitter region therefore does not extend into the base region 20 and in regions under the spacers. This is accomplished by a two-step deposition of the semiconductor layer, which includes the sub-layers 30' and 31' (see FIG. 2 and FIG. 3K), wherein the lower layer 31', which is deposited on the base region 20, is practically undoped. In this context practically undoped denotes a concentration of dopants which is so low that not significant amount of dopants diffuse out from the layer 30' into the base region 20 during following thermal treatment(s) and a diffusion zone 31 as shown in FIG. 1 is avoided.

The final emitter region (including sub-layers 30' and 31') of the second doping type is laterally confined by the spacers 40 and does not extend into the base region 20. The semiconductor layer may further extend throughout opposing inner side-walls of the spacers 40. The collector region 12 may be laterally enclosed by the shallow trench isolation 51, and the base region 20 may be laterally enclosed by portions of the first isolation layer 52. A conductive base contact layer 22 (e.g., polycrystalline silicon) may be arranged on the first isolation layer 52 and partially on the base region 20 to contact the base region. A second insulating layer 53 may arranged in the base contact layer 22, wherein the spacers 40 extend vertically through the second insulating layer 53 and the base contact layer 22 down to the top surface of the base region 20.

To electrically contact the collector, the semiconductor body may include a highly doped buried collector contact region 11 which adjoins the collector region 12 at its bottom side. The base region 20 includes a base layer 21 of the first doping type (e.g., p-type). The base layer 21 is more heavily doped than the other portions of the base layer 20.

Another aspect of this description relates to a method for fabricating a bipolar transistor. The method includes providing a semiconductor body 10 including a collector region 12 and a base region 20 arranged on top of the collector region 12. The collector region 12 is doped with dopants of a second doping type and the base region 20 is at least partially doped with dopants of a first doping type (e.g., see FIG. 3G) The semiconductor body may include a silicon substrate and an epitaxial layer disposed on the substrate. The method further includes forming insulating spacers 40 on top of the base region 20 (see FIGS. 3H and 3I). After forming the spacers 40 a first semiconductor layer 31' is disposed on top of the base region 20, so that the spacers 40 laterally enclose and confine the first semiconductor layer 31' at its interface with the base region 20 (see FIG. 3J). After depositing the first semiconductor layer 31', a second semiconductor layer 30' is disposed on top of the first semiconductor layer 31'. The second layer 30' is doped with dopants of the second doping type and more heavily doped than the first semiconductor layer 31'. The first semiconductor layer 31' may be practically undoped. Elevated temperatures are applied to the semiconductor body so that dopants diffuse out of the second semiconductor layer 30' into the first semiconductor layer 31' thus forming an emitter region 30 of the BT in the first and second semiconductor layer 30' and 31'.

Another exemplary method for fabricating a bipolar transistor includes providing a semiconductor body 10 including a collector region 12 and a base region 20 arranged on top of the collector region 12. The collector region 12 is doped with dopants of a second doping type and the base region 20 being doped with dopants of a first doping type (see FIG. 3F). The method further includes forming insulating spacers 40 on top of the base region 20 (see FIGS. 3H and 3I) and depositing a first semiconductor layer 31' on top of the base region 20 such that the first semiconductor layer 31' is laterally enclosed by the spacers 40 at least at the interface with the base region 20 (see FIG. 3J). A second semiconductor layer 30', which is doped with dopants of the second doping type, is deposited on top of the first semiconductor layer 31' (see FIG. 3K). Elevated temperatures are applied to the semiconductor body so that dopants diffuse out of the second semiconductor layer 30' into the first semiconductor layer 31' thus forming an emitter region 30 of the BT in the first and second semiconductor layer 30' and 31'. Unless explicitly mentioned, the order of the described steps may vary dependent on the actual implementation of the production process.

Forming the spacers may include forming a first isolation layer 52 on the semiconductor body 10, depositing a conductive base contact layer 22 on the first isolation layer 52, forming a second isolation layer 53 on the base contact layer 22, and partly removing the first and second isolation layers 52, 53 and the base contact layer 22 to form an opening $O_1$ which exposes the top surface of the base region 20 (see FIG. 3F). The spacers 40 are formed on the side surfaces of the opening. The base region 20 may be deposited through the opening $O_1$ on top of the collector region 12 (see FIG. 3G) such that it is electrically connected by the base contact layer 22 and it forms a pn-junction with the collector region 12.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method for fabricating a bipolar transistor (BT), the method comprising:
    providing a semiconductor body;
    forming a first isolation layer on the semiconductor body;
    depositing a conductive base contact layer on the first isolation layer;
    forming a second isolation layer on the conductive base contact layer;
    partly removing the first and second isolation layers and the conductive base contact layer thus forming an opening to expose a top surface of the semiconductor body,
    forming, in the semiconductor body, a collector region doped with dopants of a second doping type and forming, on top of the collector region, a base region arranged doped with dopants of a first doping type
    forming spacers on side surfaces of the opening;
    after forming the spacers, forming a first semiconductor layer on top of the base region, so that the spacers enclose the first semiconductor layer;
    after forming the first semiconductor layer, forming a second semiconductor layer, which is doped with dopants of the second doping type, on top of the first semiconductor layer, the second semiconductor layer being more heavily doped than the first semiconductor layer; and
    applying elevated temperatures to the semiconductor body so that dopants diffuse out of the second semiconductor layer into the first semiconductor layer thereby forming an emitter region of the BT in the first and second semiconductor layers.

2. The method of claim 1, wherein providing the semiconductor body comprises forming shallow trench isolations laterally enclosing the collector region.

3. The method of claim 1, wherein the base region is deposited through the opening on top of the collector region such that the base region is electrically connected to the base contact layer and that the base region forms a pn-junction with the collector region.

4. The method of claim 1, wherein forming the collector region comprises placing dopants into the semiconductor body via the opening thereby forming the collector region.

5. The method of claim 1, wherein forming the collector region is done before or after forming the opening.

6. A method for fabricating a bipolar transistor (BT), the method comprising:
    providing a semiconductor body;
    forming a first isolation layer on the semiconductor body;
    depositing a conductive base contact layer on the first isolation layer;
    forming a second isolation layer on the conductive base contact layer;
    partly removing the first and second isolation layers and the conductive base contact layer thus forming an opening to expose a top surface of the semiconductor body,
    forming, in the semiconductor body, a collector region doped with dopants of a second doping type, and forming, on top of the collector region, a base region arranged doped with dopants of a first doping type;
    forming insulating spacers on top of the base region;
    depositing a first semiconductor layer on top of the base region such that the first semiconductor layer is laterally enclosed by the insulating spacers;
    depositing a second semiconductor layer, which is doped with dopants of the second doping type, on top of the first semiconductor layer; and
    applying elevated temperatures to the semiconductor body so that dopants diffuse out of the second semiconductor layer into the first semiconductor layer thereby forming an emitter region of the BT in the first and second semiconductor layers.

7. The method of claim 6, wherein providing the semiconductor body comprises forming shallow trench isolations laterally enclosing the collector region.

8. The method of claim 6, wherein forming the collector region comprises placing dopants into the semiconductor body via the opening to form the collector region.

9. The method of claim 8, wherein the insulating spacers are formed on side surfaces of the opening to laterally isolate the conductive base contact layer.

10. The method of claim 6, wherein forming the base region comprises:
    depositing semiconductor material on the collector region to form the base region such that it is electrically connected by the base contact layer and it forms a pn-junction with the collector region.

11. The method of claim 6, wherein the semiconductor body includes a buried collector contact region vertically adjoining the collector region under the collector region.

12. The method of claim 6, wherein the semiconductor body includes a deep trench isolation to isolate the collector region in a lateral direction.

13. The method of claim 6, wherein substantially no dopants diffuse out of the first semiconductor layer into the base region.

14. The method of claim 6, wherein forming the collector region is done before or after forming the opening.

15. The method of claim 6, wherein forming the collector region includes implantation of dopants through the first isolation layer to form the collector region before forming the opening.

* * * * *